United States Patent
Bucelot et al.

(10) Patent No.: US 9,618,966 B2
(45) Date of Patent: Apr. 11, 2017

(54) PULSE-DRIVE RESONANT CLOCK WITH ON-THE-FLY MODE CHANGE

(71) Applicant: INTERNATIONAL BUSINESS MACHINES CORPORATION, Armonk, NY (US)

(72) Inventors: Thomas J. Bucelot, Wappingers Falls, NY (US); Robert L. Franch, Wappingers Falls, NY (US); Phillip J. Restle, Katonah, NY (US); David Wen-Hao Shan, Austin, TX (US); Christos Vezyrtzis, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/828,898

(22) Filed: Aug. 18, 2015

(65) Prior Publication Data

US 2017/0031384 A1    Feb. 2, 2017

Related U.S. Application Data

(63) Continuation of application No. 14/814,780, filed on Jul. 31, 2015.

(51) Int. Cl.
*H03K 7/08* (2006.01)
*G06F 1/10* (2006.01)
*H03K 5/159* (2006.01)

(52) U.S. Cl.
CPC .............. *G06F 1/10* (2013.01); *H03K 5/159* (2013.01); *H03K 7/08* (2013.01)

(58) Field of Classification Search
CPC .. H03K 5/01; H03K 5/04; H03K 5/05; H03K 5/06; H03K 5/07; H03K 5/065; H03K 3/017; H03K 7/08; H03K 3/78
(Continued)

(56) References Cited

U.S. PATENT DOCUMENTS

| | | |
|---|---|---|
| 5,559,478 A | 9/1996 | Athas et al. |
| 6,983,394 B1 | 1/2006 | Morrison et al. |

(Continued)

OTHER PUBLICATIONS

List of IBM Patents or Patent Applications Treated as Related, 2 pages.
(Continued)

*Primary Examiner* — John Poos
(74) *Attorney, Agent, or Firm* — Mitch Harris, Atty at Law, LLC; Andrew M. Harris; Steven L. Bennett

(57) ABSTRACT

A pulse-drive resonant clock with on-the fly mode changing provides robust operation in a resonant clock distribution network, in particular for processor circuits having a dynamically-varied operating frequency. The clock drivers for the resonant clock distribution network include a pulse width control circuit having selectable operating modes corresponding to multiple clocking modes of the resonant clock distribution network. The pulse width control circuit includes a delay line that has a selectable delay length to provide pulse enable signals that control the pulse widths of the clock drivers in a sector of the resonant clock distribution network. The delay line responds to a mode control signal so that at least one pulse width of the output is changed from a first pulse width to a second pulse width without generating half-cycles with a pulse width narrower than the first or second pulse width.

7 Claims, 9 Drawing Sheets

(58) Field of Classification Search
USPC .................. 327/172, 173, 174, 175, 176
See application file for complete search history.

(56) References Cited

U.S. PATENT DOCUMENTS

| | | |
|---|---|---|
| 7,015,765 B2 | 3/2006 | Shepard et al. |
| 7,145,408 B2 | 12/2006 | Shepard et al. |
| 7,206,343 B2 | 4/2007 | Pearce |
| 7,237,217 B2 | 6/2007 | Restle |
| 7,286,947 B1 | 10/2007 | Cranford, Jr. et al. |
| 7,400,555 B2 | 7/2008 | Franch et al. |
| 7,571,410 B2 | 8/2009 | Restle |
| 7,719,316 B2 | 5/2010 | Chueh et al. |
| 7,719,317 B2 | 5/2010 | Chueh et al. |
| 7,742,388 B2 | 6/2010 | Shearer et al. |
| 7,872,539 B1 | 1/2011 | Athas |
| 7,880,551 B2 | 2/2011 | Chan et al. |
| 7,944,229 B2 | 5/2011 | Joshi et al. |
| 7,956,664 B2 | 6/2011 | Chueh et al. |
| 7,961,559 B2 | 6/2011 | Dixon et al. |
| 8,289,063 B2 | 10/2012 | Chueh et al. |
| 8,339,209 B2 | 12/2012 | Papaefthymiou et al. |
| 8,358,163 B2 | 1/2013 | Papaefthymiou et al. |
| 8,362,811 B2 | 1/2013 | Papaefthymiou et al. |
| 8,368,450 B2 | 2/2013 | Papaefthymiou et al. |
| 8,400,192 B2 | 3/2013 | Papaefthymiou et al. |
| 8,461,873 B2 | 6/2013 | Ishii et al. |
| 8,466,739 B2 | 6/2013 | Kim et al. |
| 8,502,569 B2 | 8/2013 | Papaefthymiou et al. |
| 8,576,000 B2 | 11/2013 | Kim et al. |
| 8,593,183 B2 | 11/2013 | Papaefthymiou et al. |
| 8,611,379 B2 | 12/2013 | Raghavan et al. |
| 8,659,338 B2 | 2/2014 | Papaefthymiou et al. |
| 8,704,576 B1 | 4/2014 | Bucelot et al. |
| 8,729,975 B2 | 5/2014 | Van Goor et al. |
| 8,736,342 B1 | 5/2014 | Bucelot et al. |
| 8,847,652 B2 | 9/2014 | Chern et al. |
| 8,854,100 B2 | 10/2014 | Sathe et al. |
| 9,054,682 B2 | 6/2015 | Bucelot et al. |
| 9,058,130 B2 | 6/2015 | Bucelot et al. |
| 9,116,204 B2 | 8/2015 | O'Mahony et al. |
| 2002/0057126 A1 | 5/2002 | Hsu et al. |
| 2002/0130699 A1 | 9/2002 | Zimlich |
| 2003/0189451 A1 | 10/2003 | Ziesler et al. |
| 2003/0191977 A1 | 10/2003 | Ziesler et al. |
| 2003/0201803 A1 | 10/2003 | Kim et al. |
| 2006/0082387 A1 | 4/2006 | Papaefthymiou et al. |
| 2006/0171223 A1 | 8/2006 | Kim |
| 2007/0096957 A1 | 5/2007 | Papaefthymiou et al. |
| 2008/0150605 A1 | 6/2008 | Chueh et al. |
| 2008/0303552 A1 | 12/2008 | Chueh et al. |
| 2008/0303576 A1 | 12/2008 | Chueh et al. |
| 2009/0027085 A1 | 1/2009 | Ishii et al. |
| 2011/0084736 A1 | 4/2011 | Papaefthymiou et al. |
| 2011/0084772 A1 | 4/2011 | Papaefthymiou et al. |
| 2011/0084773 A1 | 4/2011 | Papaefthymiou et al. |
| 2011/0084774 A1 | 4/2011 | Papaefthymiou et al. |
| 2011/0084775 A1 | 4/2011 | Papaefthymiou et al. |
| 2011/0090018 A1 | 4/2011 | Papaefthymiou et al. |
| 2011/0090019 A1 | 4/2011 | Papaefthymiou et al. |
| 2011/0095802 A1 | 4/2011 | Horikoshi et al. |
| 2011/0140753 A1 | 6/2011 | Papaefthymiou et al. |
| 2011/0210761 A1 | 9/2011 | Ishii et al. |
| 2011/0215854 A1 | 9/2011 | Chueh et al. |
| 2011/0216604 A1 | 9/2011 | Mikajiri et al. |
| 2011/0260781 A1 | 10/2011 | Takeuchi et al. |
| 2012/0044958 A1 | 2/2012 | Raghavan et al. |
| 2013/0194018 A1 | 8/2013 | Papaefthymiou et al. |
| 2013/0328608 A1 | 12/2013 | Papaefthymiou et al. |
| 2014/0002175 A1 | 1/2014 | Papaefthymiou et al. |
| 2014/0002204 A1 | 1/2014 | Kim et al. |
| 2014/0015585 A1 | 1/2014 | Papaefthymiou et al. |
| 2014/0028407 A1 | 1/2014 | Chern et al. |
| 2014/0035649 A1 | 2/2014 | Nedovic |
| 2014/0062562 A1 | 3/2014 | Sathe et al. |
| 2014/0062565 A1* | 3/2014 | Sathe .................. H03K 19/003 327/294 |
| 2014/0062566 A1 | 3/2014 | Sathe et al. |
| 2014/0079169 A1 | 3/2014 | Raghavan et al. |
| 2014/0167832 A1 | 6/2014 | Bucelot et al. |
| 2014/0167868 A1 | 6/2014 | Guthaus |
| 2014/0240021 A1 | 8/2014 | Hibbeler et al. |
| 2014/0317389 A1 | 10/2014 | Wenisch et al. |
| 2015/0002204 A1 | 1/2015 | Aipperspach et al. |

OTHER PUBLICATIONS

U.S. Appl. No. 15/040,423, filed Feb. 10, 2016, Franch, et al.
Jain, et al., "On-Chip Delay Measurement Circuit", 2012 17th IEEE European Test Symposium, May 28-31, 2012, 6 pages (pp. 1-6 in pdf), IEEE Computer Society, Annecy, France.
Chan, et al., "Design of Resonant Global Clock Distributions" Proceedings of the 21st International Conference on Computer Design, ICCD '03, Oct. 13-15, 2003, 6 pages(pp. 1-6 in pdf), IEEE Computer Society, San Jose, CA, US.
U.S. Appl. No. 14/303,671, filed Jun. 13, 2014, Bansal, et al.
U.S. Appl. No. 14/814,780, filed Jul. 31, 2015, Bucelot, et al.
U.S. Appl. No. 14/820,726, filed Aug. 7, 2015, Bucelot, et al.
U.S. Appl. No. 14/828,841, filed Aug. 18, 2015, Bucelot, et al.
Chan, et al., "A 4.6GHz Resonant Global Clock Distribution Network", 2004 IEEE International Solid-State Circuits Conference, Feb. 18, 2004, 8 pages (pp. 1-8 in pdf), IEEE, San Francisco, CA, US.
Chan, et al., "Uniform-Phase Uniform-Amplitude Resonant-Load Global Clock Distributions", IEEE Journal of Solid-State Circuits, Jan. 2005, pp. 102-109, vol. 40, No. 1, IEEE, US.
Sathe, et al., Resonant-Clock Latch-Based Design, IEEE Journal of Solid-State Circuits, Apr. 2008, pp. 864-873, vol. 43, No. 4, IEEE, US.
Chan, et al., "A Resonant Global Clock Distribution for the Cell Broadband Engine Processor", IEEE Journal of Solid-State Circuits, Jan. 2009, pp. 64-72, vol. 44, No. 1, IEEE, US.
Sathe, et al., "Resonant-Clock Design for a Power-Efficient, High-Volume x86-64 Microprocessor", IEEE Journal of Solid-State Circuits, Jan. 2013, pp. 140-149, vol. 48, No. 1, IEEE, US.
Restle, et al., "Wide-Frequency-Range Resonant Clock with On-the-Fly Mode Changing for the POWER8 Microprocessor", 2014 IEEE International Solid-State Circuits Conference, Feb. 10, 2014, 3 pages (pp. 1-3 in pdf), IEEE, San Francisco, CA, US.
Chan, et al., "A Resonant Global Clock Distribution for the Cell Broadband-Engine Processor", 2008 IEEE International Solid-State Circuits Conference, Session 28, Feb. 6, 2008, 3 pages (pp. 1-3 in pdf), IEEE, San Francisco, CA, US.
Franch, et al., "On-chip timing uncertainty measurements on IBM microprocessors" IEEE International Test Conference, Oct. 2007, paper 1.1, pp. 1-7, Santa Clara, CA, US.
Amrutur, et al., "0.84 ps Resolution Clock Skew Measurement via Subsampling", IEEE Transactions on Very Large Scale Integration (VLSI) Systems, Dec. 2011, pp. 2297-2275, vol. 19, No. 12, IEEE, US.
U.S. Appl. No. 14/882,668, filed Oct. 14, 2015, Franch, et al.
Office Action in U.S. Appl. No. 14/814,780 mailed on Jun. 21, 2016, 14 pages (pp. 1-14 in pdf).

* cited by examiner

PULSE-DRIVE RESONANT CLOCK WITH ON-THE-FLY MODE CHANGE

The present Application is a Continuation of U.S. patent application Ser. No. 14/814,780, filed on Jul. 31, 2015 and claims priority thereto under 35 U.S.C. §120. The disclosure of the above-referenced parent U.S. patent application is incorporated herein by reference.

BACKGROUND OF THE INVENTION

1. Field of the Invention

The present invention is related to integrated circuits incorporating resonant clocking schemes, and more specifically to techniques for changing the mode of pulse-driven clocking schemes during operation.

2. Description of Related Art

Resonant clocking of digital integrated circuits provides low energy consumption and well-controlled clock characteristics, including reduction of jitter and predictable point-to-point delay. In some implementations, a reduced pulse width is employed in resonant clock drivers to further decrease energy consumption, since the clock drive only needs to be active long enough to restore the energy that is lost in the portions (sectors) of the resonant clock distribution network that is being driven by the individual clock drivers.

Mode changing in a resonant clock distribution network is needed for variable operating frequency, for example, in a processor integrated circuit with "turbo" operating modes or in which voltage-frequency scaling is employed to reduce energy consumption when processor activity is low. The mode changing may change operating frequency and/or may change the clock mode from resonant distribution to non-resonant. However, when changing the mode in a resonant clock distribution network, which generally also requires a change in the pulse width of the clock, the mode change may generate a glitch that can cause improper operation of the integrated circuit in which the resonant clock distribution network is implemented.

It would therefore be desirable to provide a pulse-driven resonant clocking circuit that can change modes during operation without causing clock glitches.

BRIEF SUMMARY OF THE INVENTION

The invention is embodied in a method of operation of a resonant clock driver circuit that provides for mode changing during operation.

The circuit is a clock driver for a resonant clock distribution network that includes a pulse width control circuit having selectable operating modes corresponding to multiple clocking modes of the resonant clock distribution network. The pulse width control circuit includes a delay line that has a selectable delay length to provide pulse enable signals that control the pulse widths of the clock drivers in a sector of the resonant clock distribution network. The delay line responds to a mode control signal so that at least one pulse width of the output is changed from a first pulse width to a second pulse width without generating half-cycles with a pulse width narrower than the first or second pulse width. In one implementation, the delay line is formed by an inverter (or buffer) chain having variable strength, so that the delay can be changed without including taps, i.e., multiple tap points of the delay line that can be selected using multiplexers or other logic. In another implementation, the delay line is a tapped delay line that includes a control circuit which prevents selecting a tap during intervals in which the output pulse width will be narrower than the first or second pulse width. The tapped delay line may also be split into two tapped delay lines, one for the pulse width of a first clock state and the other for the pulse width of the second clock state, so that the intervals in which tap selection is prevented are less constrained.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to digital integrated circuits containing resonant clock distribution networks, such as memory devices, processors and other circuits in which variable frequency and low power operation are desirable. The resonant clocking circuits disclosed herein are high-efficiency pulse-driven circuits that have selectable pulse widths corresponding to the different operating modes of the resonant clock distribution network. The clocking circuits include a delay line that controls the pulse widths and responds to a mode control signal so that at least one pulse width of the output is changed from a first pulse width to a second pulse width without generating half-cycles with a pulse width narrower than the first or second pulse width.

Figure 1:
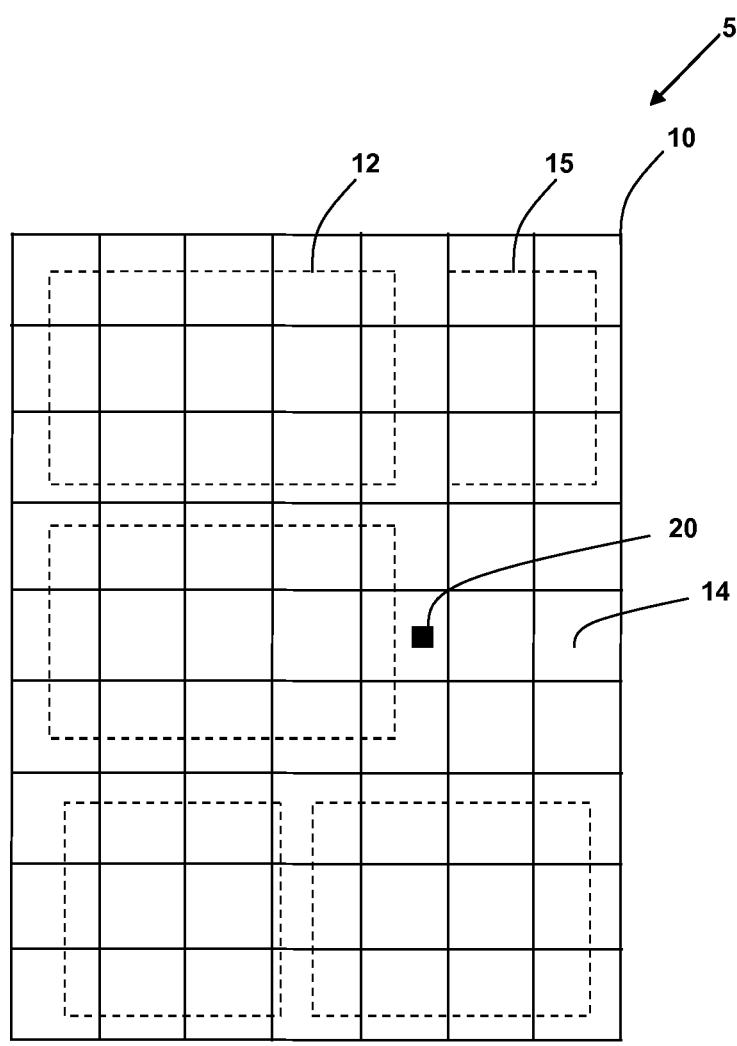
FIG. 1 is a block diagram illustrating an exemplary integrated circuit 5 having a resonant clock distribution grid 10.

With reference now to the figures, and in particular with reference to FIG. 1, an exemplary integrated circuit (IC) 5 is shown, which may represent a processor integrated circuit, a memory device, or another very-large scale integrated circuit (VLSI) that contains logic and storage. Within IC 5, a clock grid 10 provides a resonant clock distribution network. IC 5 includes a plurality of functional circuits 12, such as computation units, memories, caches, etc. and includes a power management unit (PMU) 15 that controls the clock frequency and power supply voltages within IC 5. Clock grid 10 is a metal layer grid that divides IC 5 into sectors 14, each of which includes a sector buffer 20 that locally drives clock grid 10 in accordance with a distributed global clock, generally provided by a phase-lock loop (PLL) within power PMU 15 that determines the operating frequency of IC 5 The PLL may be located separate from PMU 15, as well. Clock grid 10 is resonated at one of two or more selectable frequencies to distribute the global clock with low energy consumption and stable phase. Clock grid 10 may also be operated in a non-resonant condition, generally at a lowered frequency. A mode selection logic within PMU 15 provides mode selection, and in the instant disclosure, a mode control signal that is distributed to each of sector buffers 20 so that the resonant (or non-resonant) frequency and a pulse width for the clock drivers can be selected.

Figure 2:
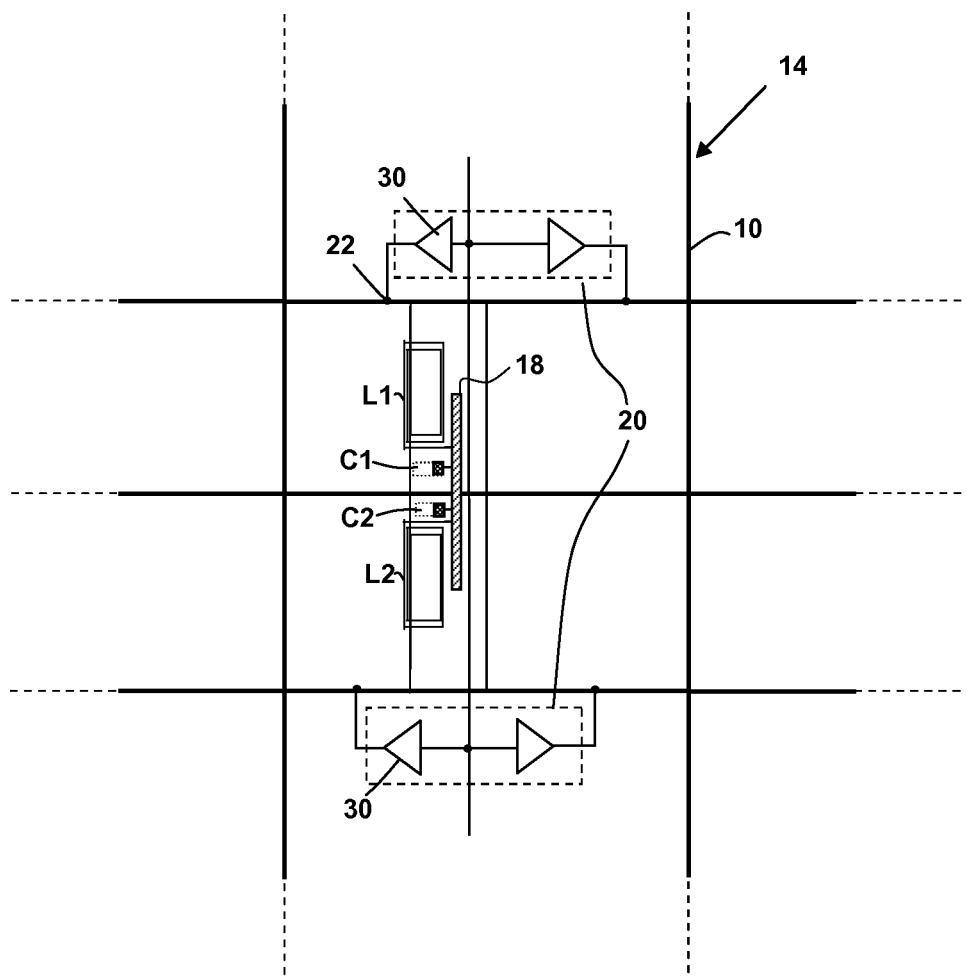
FIG. 2 is a simplified schematic diagram of a sector clock driver circuit 20 that may be used in resonant clock distribution grid 10 of FIG. 1.

Referring now to FIG. 2, details of example sector buffer 20 are shown. The depicted sector buffer 20 includes four clock drivers 30 that are connected to different drive points 22 of clock grid 10. In practice, each of clock drivers 30 will generally include a number of parallel drivers in order to reduce the output impedance of the final stage. Sector buffer 20 also includes inductors L1 and L2 and capacitors C1 and C2, which are selectively connected to clock grid 10 by a switching circuit 18 in order to change the resonant frequency of sector buffer 20, or to select non-resonant mode. By selecting the resonant frequency at each sector buffer 20 in IC 5, the frequency at which grid 5 resonates is changed. Sector buffer 20 is provided as an example of one type of sector buffer that supports multiple resonant frequencies and a non-resonant mode. However, the techniques disclosed herein apply to other types of sector buffers that use a single inductor with multiple tuning capacitors and other switching arrangements that provide for selection between modes.

Figure 3:
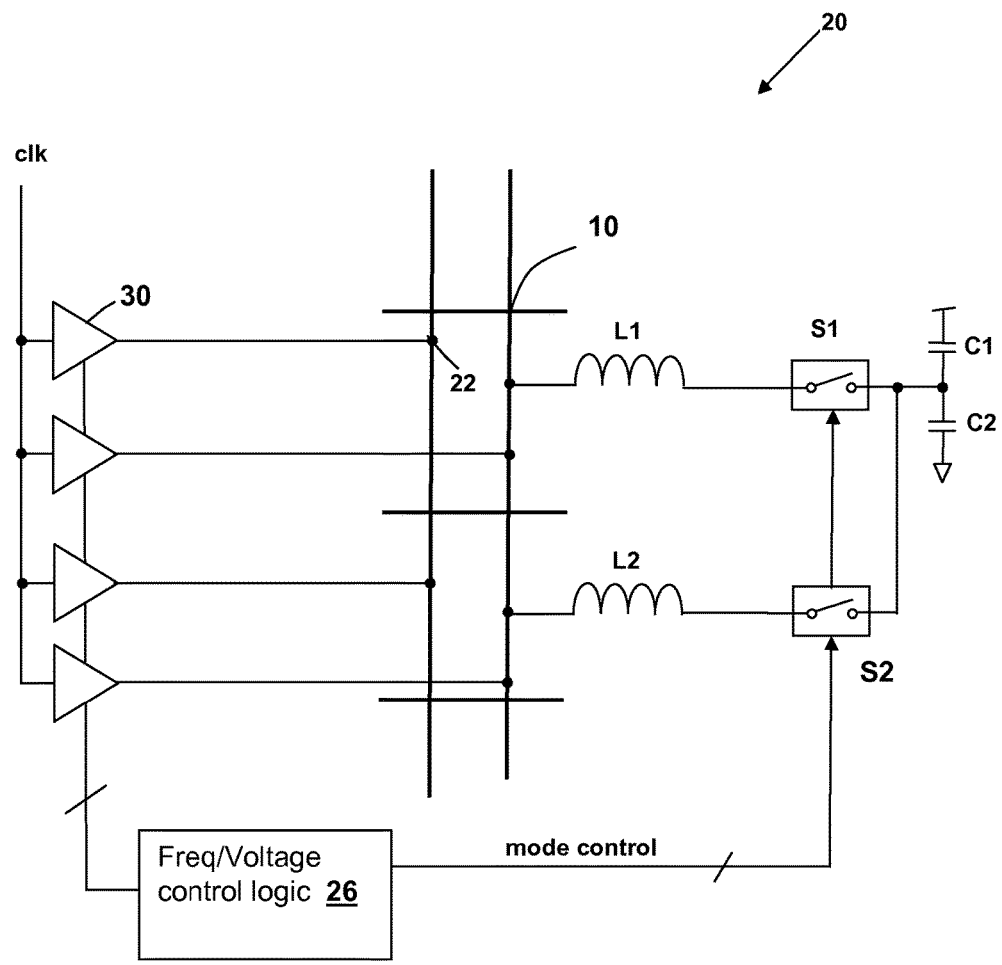
FIG. 3 is a schematic diagram of sector clock driver circuit 20 of FIG. 2.

Referring now to FIG. 3, further details of sector buffer 20 are shown. Switching circuit 18 includes switches S1 and S2, which are opened and closed to select different operating modes according to one or more mode control signals mode control provided from a frequency/voltage control logic 26 within PMU 15 of FIG. 1. If both switch S1 and S2 are open, then the resonant tank formed by one or both of inductors L1 and L2 and the parallel combination of capacitors C1 and C2 is broken and sector buffer 20 (and thus clock grid 10) will operate in non-resonant mode, and clock drivers 30 will drive a global clock waveform clk onto clock grid 10. If either or both of switches S1 and S2 are open, then the resonant tank formed by one or both of inductors L1 and L2 and the parallel combination of capacitors C1 and C2 is formed and sector buffer 20 (and thus clock grid 10) will operate in resonant mode. As long as global clock waveform clk has the appropriate frequency, i.e. within the resonant band of the tank formed by selected ones of inductors L1 and L2 and the parallel combination of capacitors C1 and C2, then clock drivers 30 will stimulate grid 10 to resonate at the frequency of global clock clk. In the instant disclosure, the pulse width of clock drivers 30 is also selected by mode control signals mode control to reduce energy consumption by clock drivers 30, so that only the required energy is transferred to grid 10. In non-resonant mode, the pulse width of clock drivers 30 is generally not reduced. Mode control signals mode control are made dynamically by frequency/voltage control logic 26 and the instant disclosure provides circuits and techniques by which glitches at the outputs of clock drivers 30 are prevented when changing modes, i.e., when selecting between different operating frequencies and/or selecting between resonant and non-resonant operating modes.

Figure 4:
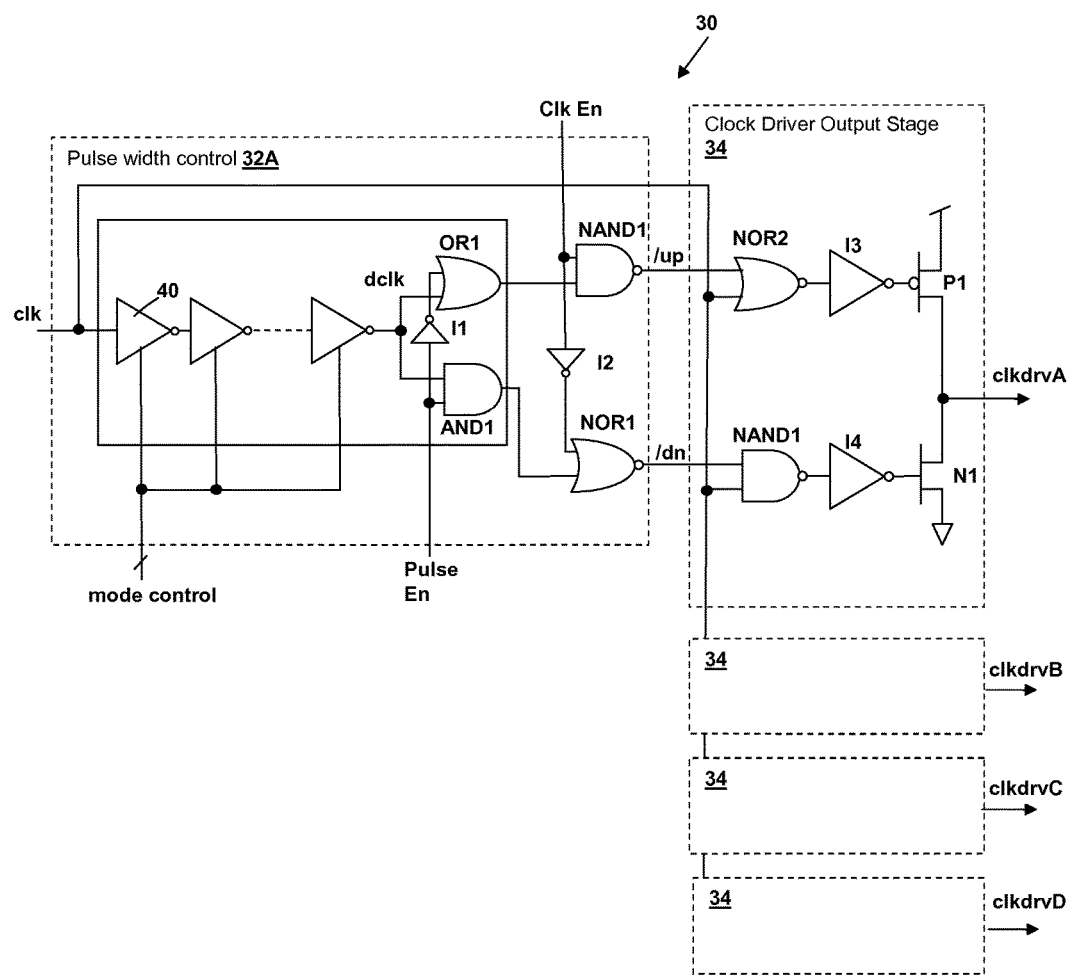
FIG. 4 is a schematic diagram of sector clock driver circuit 20 including a pulse width control circuit 32A according to a first example that may be used in the integrated circuit of FIG. 1.

Referring now to FIG. 4, details of a clock driver 30 according to a first example are shown. A clock driver output stage 34 includes a driver formed by transistors P1 and N1, which may be of greater area than other transistors used to implement logic, or as mentioned above, a number of inverters may be connected in parallel to increase the drive strength of an output clkdrvA of clock driver 30. The other three clock driver output stages 34 are identical to the illustrated clock drive output stage 34 and provide outputs clkdrvB, clkdrvC and clkdrvD for driving the other three drive points 22, as shown in FIG. 3. Clock driver output stage 34 includes logic formed by a logical-NOR gate NOR2, an inverter I3, a logical-NAND gate NAND1 and an inverter I4, which receive global clock signal clk and control the pull-up and pull-down portions of the driver, i.e., transistors P1 and N1, respectively. A pulse width control circuit 32A provides pull-up and pull-down enable signals which, in turn, provide a pulse up, dn for each state of global clock signal clk that controls the duration of the pull-up and pull-down phase of outputs clkdrvA, clkdrvB, clkdrvC and clkdrvD. Illustrated pulse width control circuit 32A is a first example of a pulse width control circuit 32A that may be used to control clock drive output stages 34 so that glitches are not produced at the outputs clkdrvA, clkdrvB, clkdrvC and clkdrvD of control clock drive output stage 34.

Pulse width control circuit 32A includes a delay line formed by a plurality of cascaded inverters 40 (or buffers, as a buffer is generally a pair of cascaded inverters) that delay global clock signal clk to produce a delayed clock dclk and are controlled according to mode control signal mode control so that the delay time of the cascade of inverters 40 is selectable. The output of a last one of inverters 40 is gated by a logic circuit composed of a logical-OR gate OR1, a logical-AND gate AND1, with an inverter I1 illustrated to provide a complement to a control signal Pulse En that enables pulse width control of clock drive output stage 34, so that, for example, pulse width control can be disabled when non-resonant clocking mode is selected. Another logic circuit is provided to enable and disable clocking entirely and is composed of logical-NAND gate NAND1, logical-NOR gate NOR1 with an inverter I2 illustrated to provide a complement to a control signal Clk En that enables clocking of clock drive output stage 34.

Figure 5:
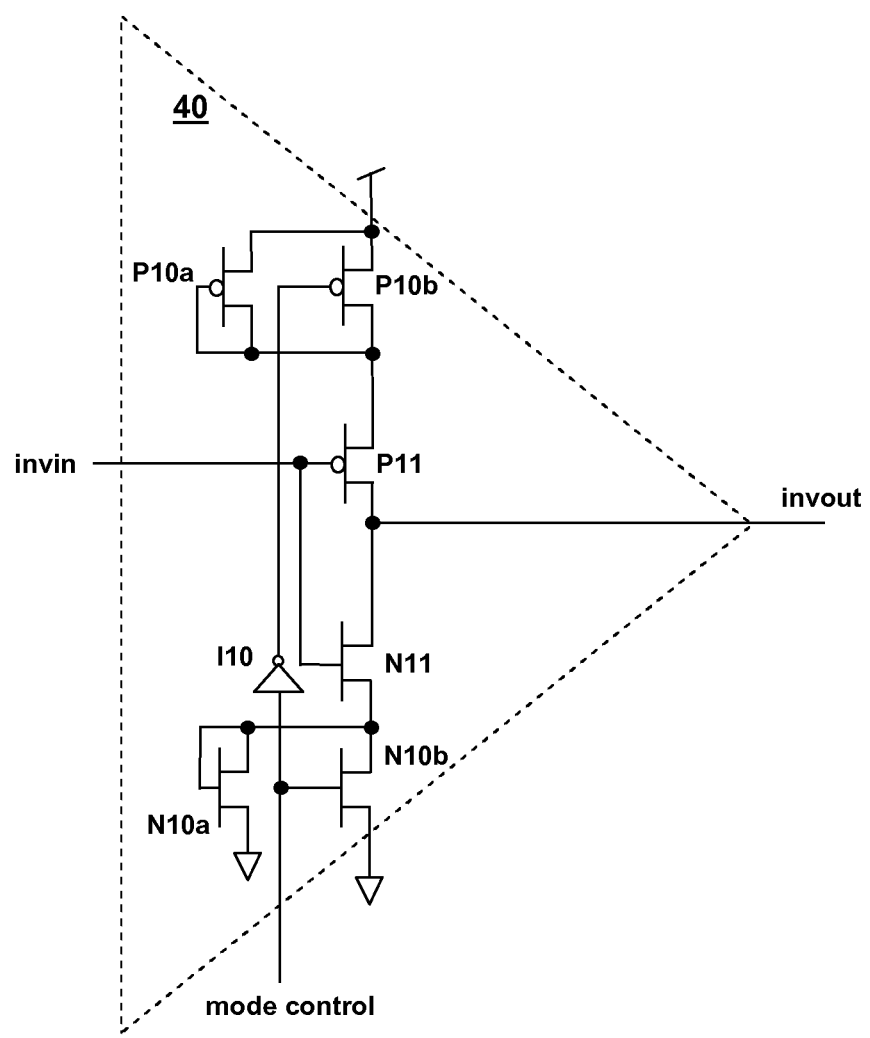
FIG. 5 is a schematic diagram of an inverter element 40 within pulse width control circuit 32A of FIG. 4.

Referring now to FIG. 5, details of inverter 40 with the above-mentioned selectable drive strength is shown. An input signal invin is provided to the input of an inverter formed by a pair of transistors P11 and N11 that provide an output signal invout. The inverter formed by transistors P11 and N11 has power supply rails supplied to the drain terminals of transistors P11 and N11 from a pair of transistors N10a and P10a configured to provide a lower current level through transistors P11 and N11, and another pair of transistors N10b and P10b configured to provide a higher current level in combination with transistors N10a and P10a, when mode control signal mode control is asserted.

An inverter I10 provides a complementary control signal for controlling the gate terminal of transistor P10b. The resulting operation provides a longer delay through inverter 40 when mode control signal mode control is/are de-asserted, which increases the delay of the delay line provided by the cascade of inverters 40 in pulse width control circuit 32A. While only three different current levels are possible with the illustrated inverter 40, in practice, any number of power supply rail current or impedance control devices can be used to provide more discrete control of delay, as will generally be needed to support a range of selectable resonant clock frequencies.

Figure 6:
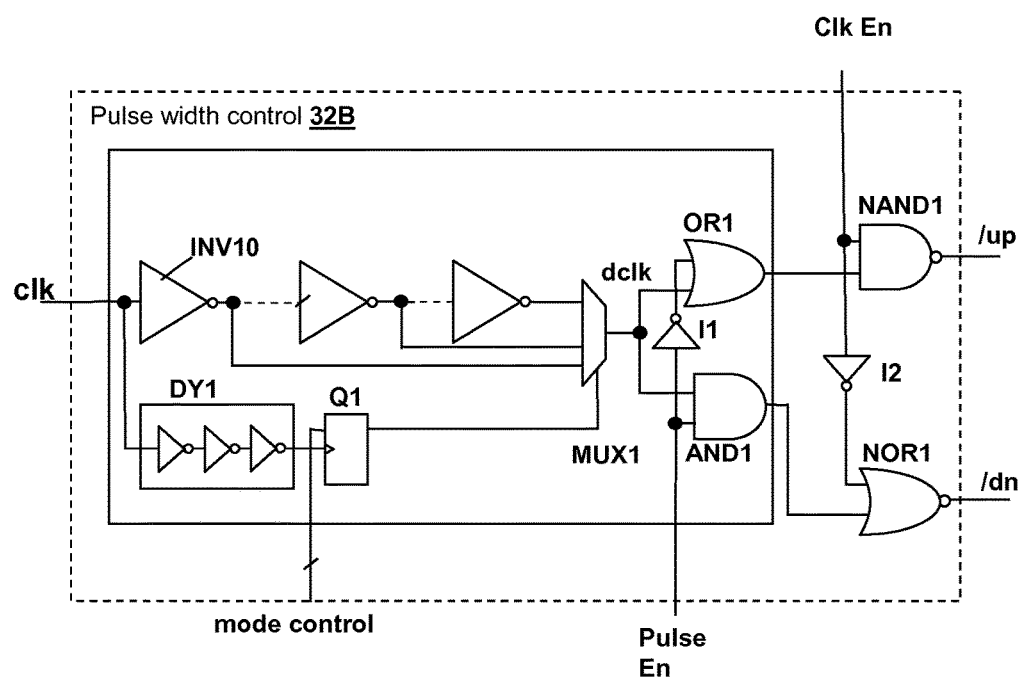
FIG. 6 is a schematic diagram of sector clock driver circuit 20 including a pulse width control circuit 32B according to a second example that may be used in the integrated circuit of FIG. 1.
Figure 8A:
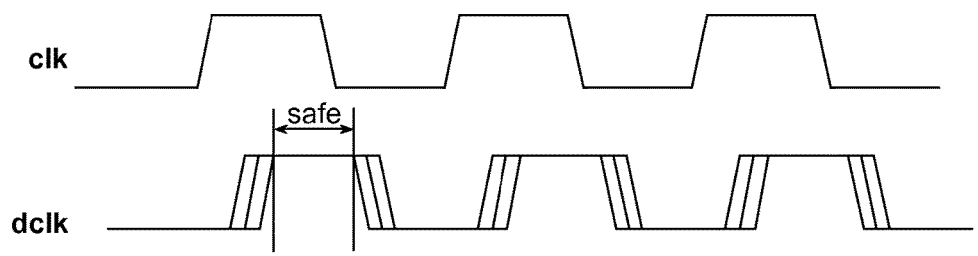
FIG. 8A is a waveform diagram illustrating signals within sector clock driver circuit 20 including pulse width control circuit 32B of FIG. 6.

Referring now to FIG. 6, an alternative pulse width control circuit 32B that can be used in place of pulse width control circuit 32A in the circuit of FIG. 4. Rather than control the strength of the buffers in a delay line, pulse width control circuit 32B includes a tapped delay line formed by a plurality of cascaded inverters INV10 and a multiplexer MUX1 that selects the tap used to produce delayed clock signal dclk. The control input(s) to multiplexer MUX1 is/are generated from one or more mode control signals mode control by a latch Q1 that is clocked by a delayed version of global clock signal clk generated by a second delay line DY1. Latch Q1 and delay line DY1 delay the update of mode control signal(s) mode control until a safe time after a transition of global clock signal clk of a particular polarity. The margin for changing mode control signal mode control must be determined for all conditions of clock frequency and mode so that the update of latch Q1 occurs sufficiently after the particular-polarity transition of global clock signal clk and before another transition of global clock signal clk in the opposite polarity might be encountered. Alternatively, a pair of delay lines with a selector could be used in place of delay line DY1 and the delay of delay line DY1 selected according to the current state of mode control signal(s) mode control. FIG. 8A illustrates a relationship between global clock clk and delayed clock dclk with a safe margin illustrated during which the delay of the delay line can be changed according to mode control signal(s) mode control without generating a glitch in delayed clock dclk, which can happen outside of the safe interval due to a transition propagating through the delay line when the selection of tap changes.

Figure 7:
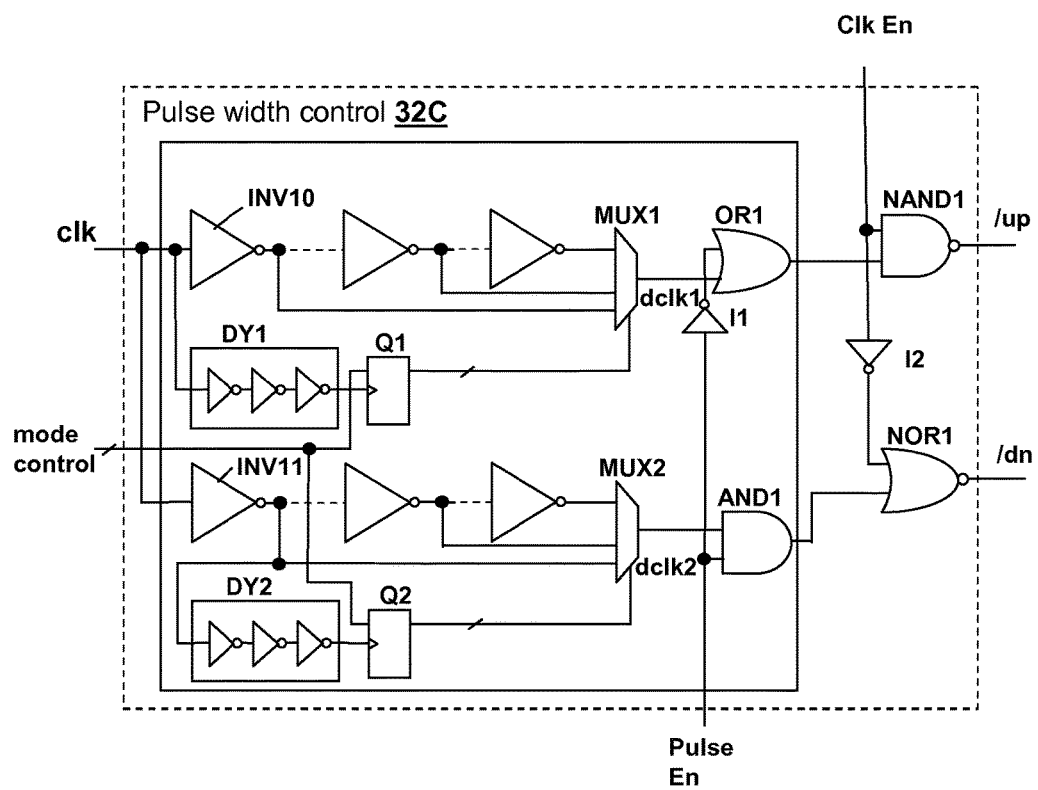
FIG. 7 is a schematic diagram of sector clock driver circuit 20 including a pulse width control circuit 32C according to a third example that may be used in the integrated circuit of FIG. 1.
Figure 8B:
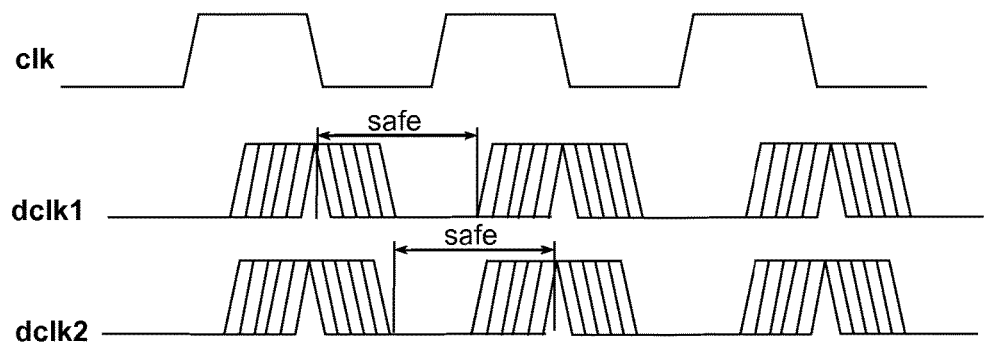
FIG. 8B is a waveform diagram illustrating signals within sector clock driver circuit 20 including pulse width control circuit 32C of FIG. 7.

Referring now to FIG. 7, another pulse width control circuit 32C that can be used in place of pulse width control circuit 32A in the circuit of FIG. 4 is shown. Pulse width control circuit 32C is similar to pulse width control circuit 32B of FIG. 6, so only differences between them are shown. Rather than updating both pulse enable controls with a single delayed version of global clock clk, pulse width control circuit 32C generates a first delayed clock dclk1 with a first delay line formed by cascaded inverters INV10 and multiplexer MUX1 and a second delayed clock dclk2 with another delay line formed by cascaded inverters INV11 and a multiplexer MUX2. Pulse width control circuit 32C also includes a delay line DY2, second multiplexer MUX2 and a latch Q2 that control the update of the mode control provided to logical-AND gate AND1, which controls the pull-down pulse width reflected in pull-down control signal/pd. The result is that timing requirements are relaxed in pulse width control circuit 32C so that delay DY1 need only be set to provide the update of latch Q1 during a safe interval between transitions to/from the pull-up phase of the outputs clkdrvA, clkdrvB, clkdrvC and clkdrvD, while delay DY2 need only be set to provide the update of latch Q2 during a safe interval between transitions to/from the pull-up phase of the outputs clkdrvA, clkdrvB, clkdrvC and clkdrvD. FIG. 8B illustrates a relationship between global clock clk and delayed clocks dclk1 and dclk2 with a separate safe margin illustrated for both, during which the delay of the delay lines can be changed according to mode control signal mode control without generating a glitch in delayed clock dclk1 or dclk2. Comparing FIG. 8B to FIG. 8A, not only are the safe margins wider while the range of selectable delay has been increased in FIG. 8B, but are non-overlapping since a glitch in delayed clock dclk1 that occurs while the pull-up circuit is not active will not cause an error in the output of the clock driver, and similarly a glitch in delayed clock dclk2 will not cause an error in the output of the clock driver while the pull-down circuit is not active.

Figure 9:
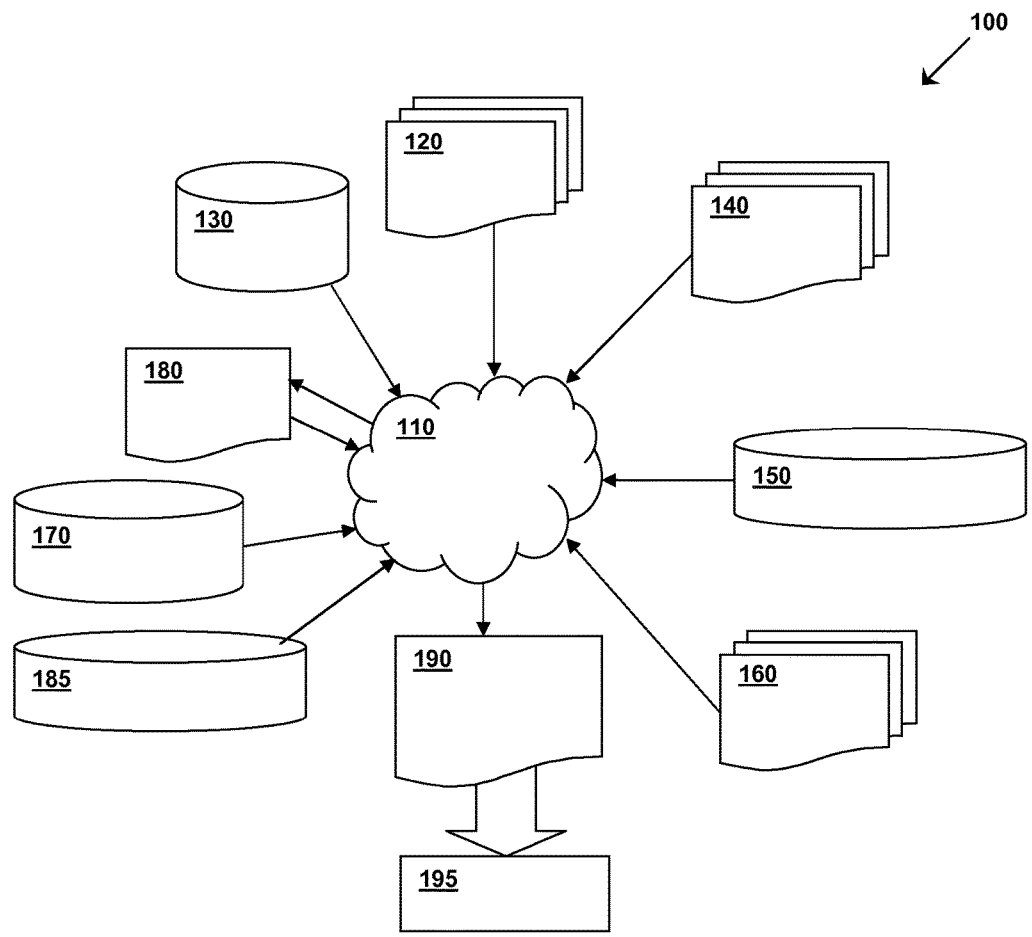
FIG. 9 is a flow diagram of a design process that can be used to fabricate, manufacture and test the integrated circuit of FIG. 1.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-7. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera Inc. or Xilinx, Inc.

FIG. 9 illustrates multiple such design structures including an input design structure 120 that is preferably processed by a design process 110. Input design structure 120 may be a logical simulation design structure generated and processed by design process 110 to produce a logically equivalent functional representation of a hardware device. Input design structure 120 may also or alternatively comprise data and/or program instructions that when processed by design process 110, generate a functional representation of the physical structure of a hardware device. Whether representing functional and/or structural design features, input design structure 120 may be generated using electronic computer-aided design (ECAD) such as implemented by a core developer/designer. When encoded on a machine-readable data transmission, gate array, or storage medium, input design structure 120 may be accessed and processed by one or more hardware and/or software modules within design process 110 to simulate or otherwise functionally represent an electronic component, circuit, electronic or logic module, apparatus, device, or system such as those shown in FIGS. 1-7. As such, input design structure 120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 110 preferably employs and incorporates hardware and/or software modules for synthesizing, translating, or otherwise processing a design/simulation functional equivalent of the components, circuits, devices, or logic structures shown in FIGS. 1-7 to generate a Netlist 180 which may contain design structures such as input design structure 120. Netlist 180 may comprise, for example, compiled or otherwise processed data structures representing a list of wires, discrete components, logic gates, control circuits, 110 devices, models, etc. that describes the connections to other elements and circuits in an integrated circuit design. Netlist 180 may be synthesized using an iterative process in which netlist 180 is resynthesized one or more times depending on design specifications and parameters for the device. As with other design structure types described herein, netlist 180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 110 may include hardware and software modules for processing a variety of input data structure types including Netlist 180. Such data structure types may reside, for example, within library elements 130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 140, characterization data 150, verification data 160, design rules 170, and test data files 185 which may include input test patterns, output test results, and other testing information. Design process 110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 110 without deviating from the scope and spirit of the invention. Design process 110 may also include modules for performing standard circuit design processes such as timing analysis, verification, design rule checking, place and route operations, etc.

Design process 110 employs and incorporates logic and physical design tools such as HDL compilers and simulation model build tools to process input design structure 120 together with some or all of the depicted supporting data structures along with any additional mechanical design or data (if applicable), to generate a second design structure 190. Design structure 190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to input design structure 120, design structure 190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 190 may comprise a compiled, executable HDL simulation model that functionally simulates the devices shown in FIGS. 1-7.

Design structure 190 may also employ a data format used for the exchange of layout data of integrated circuits and/or symbolic data format (e.g. information stored in a GDSII (GDS2), GL1, OASIS, map files, or any other suitable format for storing such design data structures). Design structure 190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 190 may then proceed to a stage 195 where, for example, design structure 190: proceeds to tape-out, is released to manufacturing, is released to a mask house, is sent to another design house, is sent back to the customer, etc.

While the invention has been particularly shown and described with reference to the preferred embodiments thereof, it will be understood by those skilled in the art that the foregoing and other changes in form, and details may be made therein without departing from the spirit and scope of the invention.

What is claimed is:
1. A method of driving a resonant clock distribution network, the method comprising:
   driving a drive point of a sector of the resonant clock distribution network with an output of at least one clock driver output stage that receives a clock input from a global clock signal;
   first enabling and disabling a pull-up driver of the at least one clock driver output stage in response to a first enable input;
   second enabling and disabling a pull-down driver of the at least one clock driver output stage in response to a second enable input;
   delaying the global clock signal with a delay line having a selectable delay selected in conformity with a mode select input to produce a delayed global clock signal; and
   controlling a clock pulse width of the clock driver output stage in conformity with the delayed global clock signal by controlling the first and second enable inputs of the at least one clock driver output by enabling the at least one clock driver output stage in response to changes in state of global clock signal and disabling the at least one clock driver output stage when the changes in state of the global clock signal have propagated through the delay line, and wherein a mode select control logic of the delay line, responsive to the mode select input, prevents the clock pulse width from enabling the at least one clock driver output stage for a duration shorter than a delay time of the delay line when the mode select input changes state.

2. The method of claim 1, wherein the delaying is performed by a tapped delay line, and wherein the mode select control logic, in conformity with the mode select input, delays a selection change of the tapped delay line until a predetermined time after a last transition of the global clock signal has occurred.

3. The method of claim 2, wherein the mode select control logic delays the selection change of the tapped delay line by latching the mode select input with a delayed version of the global clock signal.

4. The method of claim 1, wherein the delaying is performed by a pair of tapped delay lines that individually delay the global clock signal to perform a corresponding one of the first and second enabling and disabling.

5. The method of claim 4, wherein the mode select control logic delays the selection change of a first one of the tapped delay lines by latching the mode select input with a first delayed version of the global clock signal and delays the selection change of a second one of the tapped delay lines by lathing the mode select input with a second delayed version of the global clock signal.

6. A method of driving a resonant clock distribution network, the method comprising:

driving a drive point of a sector of the resonant clock distribution network with an output of at least one clock driver output stage that receives a clock input from a global clock signal;

first enabling and disabling a pull-up driver of the at least one clock driver output stage in response to a first enable input;

second enabling and disabling a pull-down driver of the at least one clock driver output stage in response to a second enable input;

delaying the global clock signal with a delay line having a selectable delay selected in conformity with a mode select input to produce a delayed global clock signal, wherein the delaying is performed by a cascade of delay elements having a selectable drive strength that is selected in response to the mode select input, whereby the delay of the delay line is adjusted without causing a transient at the output of the delay line;

controlling a clock pulse width of the clock driver output stage in conformity with the delayed global clock signal by controlling the first and second enable inputs of the at least one clock driver output by enabling the at least one clock driver output stage in response to changes in state of global clock signal and disabling the at least one clock driver output stage when the changes in state of the global clock signal have propagated through the delay line.

7. The method of claim 6, wherein the selectable drive strength is provided by at least some of the delay elements having pull-up and pull-down devices connected by a selectable pass current or impedance to corresponding power supply rail.

* * * * *